(12) United States Patent
Webb

(10) Patent No.: US 6,551,470 B1
(45) Date of Patent: Apr. 22, 2003

(54) CLAMP AND TARGET ASSEMBLY

(75) Inventor: Bruce W. Webb, Albuquerque, NM (US)

(73) Assignee: Academy Precision Materials, Albuquerque, NM (US)

(*) Notice: Subject to any disclaimer, the term of this patent is extended or adjusted under 35 U.S.C. 154(b) by 0 days.

(21) Appl. No.: 09/595,584

(22) Filed: Jun. 15, 2000

Related U.S. Application Data

(60) Provisional application No. 60/156,026, filed on Sep. 23, 1999, and provisional application No. 60/139,333, filed on Jun. 15, 1999.

(51) Int. Cl.[7] ............................................. C23C 14/34
(52) U.S. Cl. ........................... 204/192.12; 204/192.13; 204/298.12; 204/298.13
(58) Field of Search ....................... 204/298.12, 298.13, 204/192.12, 192.13

(56) References Cited

U.S. PATENT DOCUMENTS

| | | | | |
|---|---|---|---|---|
| 3,595,775 A | * | 7/1971 | Grantham et al. | 204/298.12 |
| 3,630,881 A | * | 12/1971 | Lester et al. | 204/298.12 |
| 4,448,659 A | | 5/1984 | Morrison, Jr. | 204/192 R |
| 4,834,860 A | * | 5/1989 | Demaray et al. | 204/298.12 |
| 5,066,381 A | * | 11/1991 | Ohta et al. | 204/298.12 |
| 5,244,556 A | * | 9/1993 | Inoue | 204/298.12 |
| 5,366,607 A | | 11/1994 | Lal et al. | 204/298.19 |
| 5,597,459 A | | 1/1997 | Altshuler | 204/192.12 |
| 5,685,959 A | | 11/1997 | Bourez et al. | 204/192.2 |
| 5,736,019 A | | 4/1998 | Bernick | 204/298.07 |
| 6,030,513 A | | 2/2000 | Ghantiwala et al. | 204/298.11 |
| 6,358,382 B1 | * | 3/2002 | Stucki et al. | 204/298.12 |

FOREIGN PATENT DOCUMENTS

| | | | | |
|---|---|---|---|---|
| EP | 0 951 049 | * | 10/1999 | |
| GB | 2173217 | * | 3/1986 | 204/298.12 |
| JP | 6-108241 | * | 4/1994 | 204/298.12 |

* cited by examiner

Primary Examiner—Rodney G. McDonald
(74) Attorney, Agent, or Firm—Deborah A. Peacock; Katy C. Fain

(57) ABSTRACT

A target assembly comprising a clamp and a target where, in a preferred embodiment, the need for bonding and/or a backing plate is eliminated.

45 Claims, 17 Drawing Sheets

CLAMP/TARGET
PERSPECTIVE

CLAMP/TARGET
PERSPECTIVE

CLAMP PERSPECTIVE

TARGET
TOP

TARGET SIDE

CLAMP TOP

CLAMP BOTTOM

CLAMP
SIDE

CLAMP TOP

CLAMP SIDE

CLAMP
SIDE

CLAMP/TARGET
SIDE

CLAMP AND TARGET ASSEMBLY

CROSS-REFERENCE TO RELATED APPLICATIONS

This application claims the benefit of the filing of U.S. Provisional Patent Application Ser. No. 60/156,026, entitled "Improved clamped target for deposition processes," filed on Sep. 23, 1999, and U.S. Provisional Application Ser. No. 60/139,333, entitled "Improved clamped target for gold deposition processes," filed on Jun. 15, 1999. The specifications of these two U.S. Provisional Patent Applications are incorporated herein by reference.

BACKGROUND OF THE INVENTION

1. Field of the Invention (Technical Field)

The present invention relates to targets and clamps for physical vapor deposition and similar processes.

2. Background Art

Information on physical vapor deposition and other similar processes are available from a wide variety of sources. For example, the Institute of Advanced Manufacturing Sciences (1111 Edison Drive Cincinnati, Ohio 45216-2265) provides such information to the public, for example, through its Web site (www.iams.org). The goal of most PVD and similar processes is to form a layer of material on a substrate. The formed layer is often referred to as a coating. In general, PVD coatings are between approximately 2 microns and approximately 5 microns. PVD processes encompass several different types of deposition processes in which atoms are removed by physical means from a source and deposited on a substrate. For example, processes that use thermal energy and/or ion bombardment are PVD processes that convert a source material into a vapor, which can later condense on a substrate. Thus, PVD processes typically involve evaporation of a first condensed phase to form a gas or vapor phase. The gas or vapor phase is then transported to or otherwise brought into contact with a substrate. The gas or vapor phase then condenses on the substrate to form a second condensed phase. It is important to note that the first and/or second condensed phases optionally comprise a solid phase and/or a liquid phase.

In a typical PVD process a substrate or "workpiece" is placed in a vacuum chamber and a very high vacuum is drawn. The vacuum chamber space is heated to between approximately 400° F. and approximately 900° F., depending on the specific process. Where plasma etching is used, plasma is created from an inert gas such as argon to further clean the surface of the workpiece. Next, the source or coating metal is forced into a gas or vapor phase.

Three methods of forcing a source metal, alloy or compound thereof are commonly used: evaporation, sputtering, and ion plating. Evaporation comprises use of a high-current electron beam or resistive heaters to evaporate source material from, for example, a crucible. The evaporated material forms a cloud that fills the deposition chamber and then condenses onto the substrate to produce the desired film. In such a process, atoms take on a relatively low energy state (0.2 to 0.6 eV) and the deposited films, as a result, are not excessively adherent or dense. In some instances, deposition of a substantially uniform coating may require complex rotation of the substrate since the vapor flux may be localized and directional.

Sputtering is another method wherein the surface of the source material is bombarded with energetic ions, usually in an ionized inert gas environment comprising, for example, argon. The physical erosion of atoms from the coating material that results from this bombardment is known as sputtering. The substrate is positioned as to intercept the flux of displaced or sputtered atoms from the target. Sputtering deposits atoms with energies in the range of 4.0 to 10.0 eV onto a substrate. While sputtering is, in general, more controllable than evaporation it can be a rather inefficient way to produce vapor. For example, energy costs for sputtering processes are typically 3 to 10 times that of evaporation processes.

Another method is ion plating, which can produce superior coating adhesion by bombarding the substrate with energy and during deposition process. In ion plating processes, particles accelerate towards the substrate and arrive with energy levels up to hundreds of electron volts. These atoms sputter off some of the substrate material resulting in a cleaner, more adherent deposit. This "cleaning" process continues as the substrate is coated. The film growth is assured when the deposition rate is faster than the sputtering or cleaning rate. In general, high gas pressure results in greater scattering of the vapor and a more uniform deposit on the substrate.

An important variation on these processes involves the introduction of a gas such as oxygen or nitrogen into the chamber to form oxide or nitride deposits, respectively. These reactive deposition processes are used to deposit films of material such as titanium nitride, silicon dioxide, and aluminum oxide.

Overall, PVD processes results in a thin, uniform coating that is much less likely to require machining after application. The specifics of the aforementioned three variations of PVD processes are by no means exclusive. For example, some PVD processes use laser ablation or pulsed laser deposition to release a controlled amount of target material in the form of a gas. Also consider that accelerated plasma can be used in the PVD process to deliver a heat pulse to a target to release a controlled amount of gaseous target material.

Physical vapor deposition, and similar deposition processes are used, for example, in the fabrication of thin film materials, such as, but not limited to, fabrication of thin films for "compact discs" (CDs). For example, sputtering processes are often involved in the coating of a semiconductor wafer or other substrate mounted within a processing chamber. In a typical semiconductor manufacturing, sputtering process, an inert gas is introduced into a processing chamber containing a target and an electric field is applied to ionize the inert gas. Positive ions of the inert gas bombard the target material and dislodge atoms from the target, which are subsequently deposited onto the wafer or other substrate in the form of a thin film. In many instances, the target is held within the deposition chamber by a device called a sputter-coating source. Often, the sputter-coating source has an electrical circuit for biasing the target material structure with a negative voltage, either DC for conductive targets, or AC having a radio frequency for non-conductive targets, so the target will attract positive ions from the plasma of an inert gas. To cool the sputter-coating source, a cooling circuit is often provided for the target structure. In addition, magnetic fields are useful for containing and enhancing the plasma.

In a semiconductor manufacturing, sputtering process, positive ions extracted from the plasma are accelerated to a high kinetic energy. These high kinetic energy ions strike the surface of the target structure whereby a portion of the kinetic energy is transferred to the target atoms of the target or source material. Target atoms that obtain sufficient energy to overcome their respective binding energy escape from the target surface and are ejected into the vacuum chamber. Objects, such as a substrate or a semiconductor wafer, placed in the line-of-sight of the target source are then coated by the atoms ejected from the target surface. Of course, it may be possible to "bend" the line-of-sight through application of electromagnetic and/or other energy.

In the prior art it is common to bond the metal or metal alloy target to a copper backing plate. An indium-based bonding technology is generally used to attach the target to the backing plate. The backing plate is required in order to support the target in the chamber in which the sputtering takes place. Often, materials used to bond the target to the backing plate contribute to contamination during the deposition process. In addition, bonding materials can interfere with the maintenance of electrical and/or thermal conductivity of the backing plate and the target. The deficiencies are dependent on the type of bonding material used; however, to date no single bonding material has emerged that does not introduce some process limitation. For example, some bonding agents have operating temperature restrictions. If the temperature of the bonded source exceeds a temperature restriction, then the bond may break and/or bonding material may enter the gas or vapor phase and consequently deposit onto a substrate. Therefore, a need exists for better bonding technology and/or altogether elimination or drastic minimization of the need for bonding material.

Note that the following discussion may refer to a number of publications by author and year of publication, and that due to recent publication dates certain publications are not to be considered as prior art vis-a-vis the present invention. Discussion of such publications herein is given for more complete background and is not to be construed as an admission that such publications are prior art for patentability determination purposes.

SUMMARY OF THE INVENTION (DISCLOSURE OF THE INVENTION)

In a preferred embodiment, the present invention comprises a target assembly for PVD and similar processing equipment comprising at least one target and a clamp wherein the clamp clamps the target to the processing equipment. The present invention however is not limited to clamping, but rather, it encompasses attaching a target to the processing equipment with a component referred to herein as a clamp. In alternative embodiments, a clamp of the present invention is attached to the processing equipment through use of mechanical, chemical, metallurgical, electromagnetic, and/or magnetic attachment mechanisms. These mechanisms include, but are not limited to, welds, adhesives, ears, bolts and/or studs and the like. The clamp is optionally attached in a permanent manner to the processing equipment or in a removable manner. If the clamp is attached in a permanent manner, then it is preferred to provide a clamp comprising a mechanism for replacement of a target.

Stainless steel is a preferred material of construction of clamps of the present invention. However, other materials, including non-metals, are suitable depending on the processing conditions. Such other materials are known in the art of PVD and similar processes.

In a preferred embodiment, the target assembly comprises a ring-shaped clamp. In such an embodiment, the ring-shaped clamp fits over a substantially hat-shaped target that comprises a brim. The thickness and/or shape of the brim preferably matches and/or conforms to the ring shape of the clamp. In a preferred embodiment, the clamp comprises a diameter greater than that of the target; however, it is possible to configure a target assembly according to the present invention wherein the target comprises a diameter larger than that of the clamp. In such an instance, it is preferred that the clamp comprises at least one diameter that matches a diameter of the target. Of course, the diameter of the target and/or clamp may extend only over an arc and not a complete circle. Where the clamp comprises a diameter larger than the largest diameter of the target, the portion of the clamp that extends beyond the largest diameter of the target is optionally used for attaching the target assembly to the processing equipment. For example, this portion optionally comprises an annular region comprising apertures and/or other points for attachment. Alternatively, or in combination with such embodiments, the annular region is attached to the processing equipment through chemical, metallurgical, electromagnetic, and/or magnetic mechanisms. For example, but not limited to, a lower surface of an annular region of the clamp is attached through weld and/or adhesive attachment mechanisms. In a preferred embodiment, the size and/or shape of the brim are chosen to maximize material available for PVD and/or similar processing. Thus, according to such an embodiment, the amount of target material in a brim is minimized with respect to the total amount of material in the target. However, brim size and/or shape must be sufficient to carry any pressure applied by a clamp in attaching the target assembly to the processing equipment.

In a preferred embodiment, a clamp of the present invention comprises at least one aperture for receiving at least one bolt, stud, ear and/or other attachment fixture that is preferably positioned on the processing equipment. According to a preferred embodiment, a clamp comprising at least one aperture comprises at least one aperture comprising at least a partially open side. In such an embodiment, the partially open side provides for reception of at least one bolt, stud, ear and/or other attachment fixture that is preferably positioned on the processing equipment.

In a preferred embodiment, a clamp comprises at least one slot for contacting at least one bolt, stud, ear and/or other attachment fixture that is preferably positioned on the processing equipment. In such a preferred embodiment, the slot optionally comprises at least one surface that is horizontal, inclined, grooved, declined and/or marked with surface indicia that optionally increase friction between the surface and an attachment fixture. According to this embodiment, at least one of the attachment fixtures, comprising, for example, bolts, studs, ears and/or other attachment fixtures, travels in at least one of the at least one slot.

According to a preferred embodiment, the target comprises a hat shape comprising a brim wherein the brim comprises an upper surface. Of course, the hat shape need not comprise a circular horizontal cross-section. In general, targets and/or clamps of the present invention comprise at least one horizontal cross-section wherein at least one of the horizontal cross-sections optionally comprises a circular, oval, ellipsoidal, and/or polygonal cross-section. Furthermore, a target optionally comprises a brimless "hat" shape, for example, but not limited to, a cone with a portion from the point downward removed, e.g., a partial cone shape. In such an embodiment, the target comprises at least one sloped surface wherein a clamp optionally contacts at least a portion of that surface with an edge and/or a matching sloped surface. For example, a clamp comprising an inclined inner surface for receiving a sloped surface of a target is within the scope of the present invention. Where a brim is present, a clamp preferably contacts an outer and/or upper surface of the brim. In general, targets and/or clamps of the present invention comprise at least one vertical cross-section wherein at least one of the vertical cross-sections optionally comprises a circular, oval, ellipsoidal, and/or polygonal cross-section. For example, in a preferred embodiment, a ring shaped clamp optionally comprises a circular or annular horizontal cross-section and a vertical cross-section comprising two separate polygons.

The present invention optionally comprises a target and/or a clamp comprising threads and/or other locking mechanisms that are optionally machined into at least a portion of a matching surface of a clamp and a target. In such embodiments, the target and clamp are screwed and/or otherwise attached to each other.

In a preferred embodiment, a target assembly attaches to the processing equipment through rotation of the assembly about a central axis of the assembly. In alternative embodiments, the assembly is attached to the processing equipment through rotational and/or translational motion.

In a preferred embodiment, the clamp comprises at least one piece. A single piece clamp optionally comprises a single piece of material that is machined and/or cast. In an alternative embodiment, a clamp comprises a plurality of cooperative pieces. For example, but not limited to, two semi-circular ring pieces and/or a central ring to which additional cooperative pieces are attached. Of course, clamps of the present invention are not limited to ring-like or circular shapes.

According to the present invention, a target comprises a metal and/or other material useful in the manufacture of products by PVD and similar processes. In a preferred embodiment, a target comprises a metal such as, but not limited to, gold, silver, niobium, tantalum, platinum, palladium, rhodium, iridium, ruthenium, and osmium. Targets of the present invention optionally comprise an alloy and/or a metal compound. In a preferred embodiment, a target comprises a ceramic, such as, but not limited to, ceramics for manufacture of "read-write" CDs (CD-RW) and the like. Of course, targets comprising pure materials and/or a mixture of materials are within the scope of the present invention.

In a preferred embodiment, a target comprises a shape that promotes processing. For example, in a preferred embodiment, a target comprises at least one aperture wherein the at least one aperture is optionally a central aperture positioned on a central axis of the target. As known in the art, such a feature is useful for the production of DVDs and CDs. Of course, targets optionally comprise a variety of shapes; for example, a target optionally comprises at least one circular, oval, ellipsoidal, and/or polygonal cross-section. According to a preferred embodiment, a clamp comprises an opening for receiving at least one of an at least one cross-section of the target. Of course, clamps that comprise more than one piece optionally comprise at least one of an at least one cross-section of the target when cooperatively assembled. Of course, in alternative embodiments, a clamp need not necessarily comprise a cross-section that matches a complete cross-section of a target; however, at least a partial match is preferred.

The present invention also comprises an inventive method of using a target assembly with processing equipment. In a preferred embodiment, the inventive method comprises the steps of providing a target and providing a clamp for clamping and/or otherwise attaching the target to process equipment. Again, as stated above, attachment mechanisms include, but are not limited to, mechanical, chemical, metallurgical, electromagnetic and/or magnetic attachment mechanisms.

In a preferred embodiment of the method, the target, the clamp and/or the target assembly comprises a known mass. In a preferred embodiment, the method optionally comprises the step of operating the process equipment to diminish the mass of the target. Accordingly, the method optionally comprises the step of removing the target and/or target assembly from the process equipment and from the clamp after an operating step. An additional further step comprising determining the mass of the target, clamp and/or target assembly after an operating step is within the scope of the present invention.

In a preferred embodiment, the present invention comprises a method of using a target assembly comprising the steps of providing a target assembly of a known mass, clamping and/or otherwise attaching the target assembly to process equipment, operating the process equipment to diminish the mass of the target assembly, removing the target assembly from the process equipment, and determining the mass of the target assembly. Of course, sophisticated process equipment that comprises the ability to determine the mass of a target, clamp and/or target assembly without removal is within the scope of the present invention.

An objective of the method is to determine the amount of diminished mass of the target from operation.

A primary object of the present invention is to minimize the need for bonding materials.

A primary advantage of the present invention is that the need for bonding material is minimized and/or eliminated.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
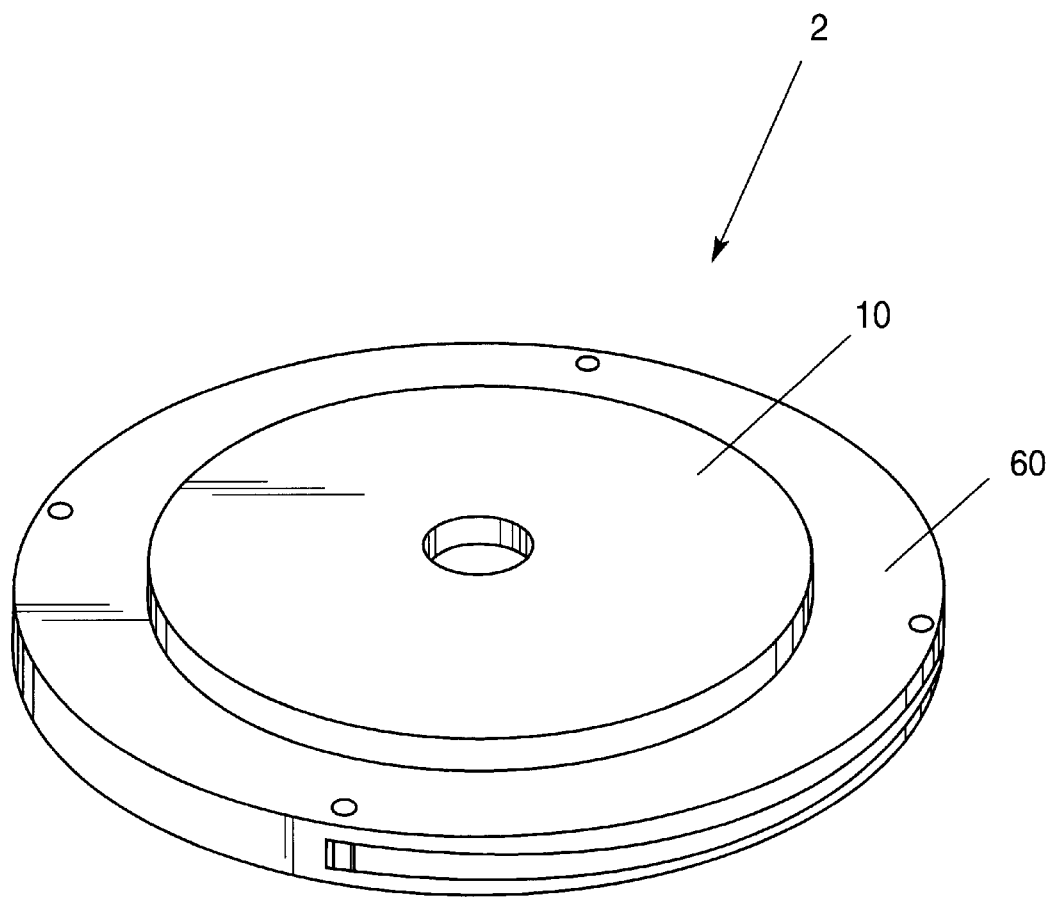
FIG. 1 is a perspective view of a target assembly of a preferred embodiment of the present invention.

DESCRIPTION OF THE PREFERRED EMBODIMENTS (BEST MODES FOR CARRYING OUT THE INVENTION)

The present invention minimizes and/or eliminates the need for bonding material through use of a clamp and target, in combination, referred to herein as a target assembly. In a preferred embodiment, the need for a traditional backing plate is eliminated. In a preferred embodiment, the present invention comprises a clamp and a target. In a preferred embodiment, the target comprises at least one piece that is optionally supportable in a reaction chamber of the process equipment by a clamp of the present invention. In a preferred embodiment, a clamp optionally comprises a clamp that is integral with the chamber and/or a clamp that comprises at least one piece, removably attachable to the chamber. According to a preferred embodiment of the present invention, a clamp assures proper electrical and/or thermal conductivity of a clamped target. Of course, a clamp that is integral with the chamber (process equipment) is within the scope of the present invention, especially wherein the clamp allows for replacement of at least one target.

In a preferred embodiment, target assemblies of the present invention are useful for DVD and CD-R production wherein, for example, silver, gold, and/or other metals are used. For such uses, target assemblies of the present invention offer considerable cost savings for processes using silver or gold CD-R and DVD targets. According to a preferred embodiment, the inventive target assembly reduces the amount of precious metal per target and eliminates the need for bonding. Both of these attributes lower cost and result in faster turnaround times for recycling spent targets. In general, the present invention does not inhibit target performance in the areas of thermal transfer, film uniformity or hardware. In a preferred embodiment, the inventive target assembly allows for an increase in the number of discs coated and longer run times between target changes. According to a preferred embodiment, the specifics of the target assembly are adapted and/or retrofitted to be useful with most processing systems. In many instances, the overall geometry is the same as that of a traditional composite target assembly.

According to a preferred embodiment, a solid metal target is easier to handle and also lends itself to much simpler metal accounting protocols. This is no small matter when dealing in gold and silver. In a preferred embodiment, a spent solid target does not require refining and can be remelted directly. In a preferred embodiment wherein bonding and backing plates are not used, the associated cost of bonding and backing plates is no longer a component of the target cost. In such an embodiment, this reduces the cost per disc coated accordingly.

Several embodiments of the present invention are of interest to suppliers of silver, gold, special precious metal alloys and silicon for CD-R, DVD and other processes as well as suppliers of targets and evaporation products for CD mastering and CD-RW formats.

Target life is dependent upon the amount of material being deposited. Thicker deposited layers will result in reduced area being coated; thinner films will coat more surface area. The finer grain structure does have an effect on sputter yield. Typically an increase of 5% or so can be obtained from fine structure benefits. The value in a finer grain structure comes from the theory of sputtering. A finer grain has greater surface area than a larger grain. The energy associated with the smaller grain is higher than that of a larger grain. Therefore, the material will ionize at a lower energy. All other things being equal, finer grain will sputter at a faster rate than a larger grain. Therefore, according to a preferred embodiment of the present invention, the grain size of a target is on the order of approximately 25 to approximately 35 microns. In such an embodiment, the nominal shape of is spherical and uniformly dispersed.

While preferred embodiments of the present invention do not rely on bonding, in some instances, use of a clamp in conjunction with bonding and/or a backing plate provides a superior target assembly. A combination of bonding and clamping allows for use of very high cost materials such as, but not limited to, gold or platinum that may have very large backing plates and cannot be clamped by traditional devices. Other materials do not adequately carry a substantial clamping load such as, but not limited to, silicon, indium tin oxide, etc., and traditionally require bonding. According to an embodiment of the present invention, clamps of the present invention provide an opportunity to balance bonding and clamping. In such instances, bonding is isolated to specific regions of the target and/or otherwise minimized.

For many CD applications using metals, a clamped configuration works better than bonding because of the higher yield, better thermal conductivity and lower cost contribution. In most instances, bonding is relatively expensive; therefore it always makes sense to evaluate the savings in metal versus the added cost of bonding and recovery of the metal after the target is spent. Other CD applications wherein "read and write" CDs (CD-RW) are manufactured, the inventive target optionally comprises a ceramic and/or other material known in the art of CD-RW.

Two common bonding techniques within the scope of the present invention for embodiments comprising bonding comprise indium bonding and elastomer bonding. Indium bonding typically incorporates a layer of indium about 0.010 inch to approximately 0.020 inch thick. According to the indium technique, a target is pre-coated with one or more foundation layers to prevent and/or reduce indium from dissolving into the target and to promote good adhesion. Elastomer bonding is similar except it has a conductive rubber material in place of the indium. The elastomer can in some instances allow for a higher operating temperature; however, elastomer reactivity to a target is an issue that should be addressed.

In a preferred embodiment, the target assembly comprises a circular configuration. However, the present invention is not limited to circular configurations. The target assembly optionally comprises an ellipsoidal and/or polygonal configuration or any other type of configuration that is suited to the particular substrate to be coated. For example, DVDs and CDs comprise circular shapes, thus, for manufacture of DVDs and CDs; a target assembly comprising a circular configuration is preferred. Of course, the clamp optionally comprises a configuration different than the target, as long as the target assembly achieves the objectives of the present invention.

In a preferred embodiment, the target assembly maximizes the amount of target material available for processing. In such an embodiment, other considerations are optionally taken into account to maximize the amount of target material available for processing. For example, in a preferred embodiment, the clamp covers a portion of the target wherein the covered portion is generally unavailable for processing, i.e., being evaporated and deposited onto a substrate. The portion of the target covered by the clamp ensures that the target is clamped properly to a surface of the processing machine. In some operations, pressure applied by the clamp to the target is substantially evenly distributed about the target. For example, a clamp comprising a single point of contact with the target is rather unlikely to distribute pressure substantially evenly about the target. In some operations, an uneven distribution of pressure about the target can result in undesirable coating of a substrate. In addition, it is generally desirable to ensure that the target is in substantially uniform contact with a surface of the processing machine, especially when thermal and/or electrical conductivity must be maintained with the machine. Thus, according to a preferred embodiment of the present invention, the clamp comprises a perimeter that completely encompasses a section of the target and applies pressure substantially evenly to that section of the target. For example, in one embodiment of the present invention, the target assembly comprises an annular clamp and hat-shaped target comprising a brim. In this embodiment, the annular clamp contacts, covers and applies pressure to the brim portion of the hat-shaped target. Of course, a thin and narrow brim results in a less unavailable target material; however, a thin and narrow brim may not adequately bear pressure applied by the clamp. Thus, according to this embodiment, a balance is struck to optimize the size of the brim; thereby providing for maximum target availability and suitable target integrity. While this embodiment was described for illustrative purposes as comprising a hat-shaped target, the present invention is not limited to hat-shaped targets. In a preferred embodiment comprising a circular configuration, the target assembly comprises the target comprising a shoulder and a stainless steel annular ring having a stepped inner surface that matches the shoulder of the target.

In a preferred embodiment, targets are machined to achieve a desired shape, or alternatively, targets are formed as an ingot in, for example, a crucible comprising a desired shape. Of course, a combination of machining and ingot formation is within the scope of the present invention as well.

As referred to above, a preferred use of the target assembly of the present invention comprises PVD and similar processes. In such uses, the target assembly is configured to process equipment specifications. For instance, a particular piece of process equipment comprising a vacuum chamber may have a specific type attachment mechanism for attaching targets and/or target assemblies within the vacuum chamber. In a preferred embodiment, the present invention comprises a target assembly that attaches to such a mechanism or mechanisms. Thus, a target assembly of the present invention optionally comprises at least one type of attachment mechanism for attaching the assembly to at least one type of process equipment. In a preferred embodiment, the target assembly comprises a universal attachment mechanism capable of attaching the assembly to at least one type of process equipment. Some vacuum chambers comprise "ears" and/or threaded holes for receiving a target and/or target assembly. In a preferred embodiment, the clamp comprises at least one hole for receiving at least one ear. Such an embodiment optionally comprises a ramped slot whereby rotation and/or translation of the inventive clamp about the at least one ear further secures the clamp to the process equipment. In a preferred embodiment, the inventive clamp comprises a slot comprising an inclined lower surface that inclines at a grade of approximately at least 1% and preferably at least approximately 3%, and most preferably at least approximately 6%. In an embodiment comprising a circular configuration, rotation of the clamp causes the pressure to increase between at least one ear and at least one inclined lower surface of a slot. Of course the present invention is not limited to ears and/or slots comprising inclined surfaces; thus, other mechanisms of attachment known in the art of fixing objects to a surface are within the scope of the present invention. Mechanisms of attachment include, but are not limited to, mechanical, chemical, metallurgical, electromagnetic, and/or magnetic attachment mechanisms. Chemical attachment mechanisms include, but are not limited to, adhesives, elastomers, and/or polymers. Metallurgical attachment mechanisms include, but are not limited to, welds.

According to a preferred embodiment of the present invention, the target assembly allows for increased productivity when compared to existing targets designed for same and/or similar machines and uses. Increased productivity, for example, is defined as the number of workpieces processed before replenishing a target. In performance test, a preferred embodiment of the present invention exhibited an increase in productivity in excess of 50%. Thus, in some operations, a target of such an embodiment can process at least one-half as many workpieces before target exhaustion.

According to the present invention, target metals comprise, for example, but not limited to, gold, silver, niobium, tantalum, platinum, palladium, rhodium, iridium, ruthenium, and osmium, as well as any other high intrinsic value metals, any alloys and/or compounds thereof. For a variety of reasons, the present invention is well suited to targets comprising high intrinsic value metals, such as, but not limited to, gold. For example, the present invention presents an opportunity to minimize "carrying costs" associated with many precious and semi-precious target metals, i.e., the time during which a target metal is either held in inventory, is a work-in-process, or delivered. Carrying costs are often of considerable concern to the cost effectiveness of the entire process. For example, where bonding of a target is required, the process of bonding the target to the backing plate according to prior methods often takes three to five days.

In a preferred embodiment, the need for a bonding step is completely eliminated. Of course, other embodiments of the present invention may optionally rely on bonding. In such other embodiment, bonding may optionally promote thermal and/or electrical conductivity. In addition, an embodiment comprising a clamp bonded to a plate is within the scope of the present invention, preferably wherein no bonding material contacts the target. In such an embodiment, target replacement optionally comprises removing the clamp from the plate. Of course, the invention is not limited to a clamp comprising a single piece; thus, a clamp comprising a plurality of cooperative pieces is within the scope of the present invention, for example, but not limited to, a clamp comprising a ring with a plurality of cooperative prongs attached thereto wherein the plurality of prongs attach to the target and/or a piece of process equipment.

In a preferred embodiment, the target assembly provides for a decrease in the cost of refining consumed targets. In general, precious and semi-precious consumed targets are returned to a supplier to be refined. When a target is chemically bonded to a backing plate, the target metal returned to the refiner is typically contaminated with the bonding materials and/or material from the backing plate. The contamination increases the cost of the refining, and of course, the overall cost of the process, especially for processes requiring high purity targets.

In a preferred embodiment, the present invention alleviates some problems associated with prior art bonded targets. In particular, the standard method for pricing targets is to weigh a target prior to use, and then to re-weigh it after use, charging the customer for the amount of the metal consumed. When the target metal is bonded to a backing plate the metal typically becomes contaminated with the bonding material, which results in a more complicated weighing and re-weighing process. In a preferred embodiment of the present invention, bonding is not required; therefore the pricing method is simplified.

In a preferred embodiment, the present invention eliminates the need for bonding and/or a backing plate. Such embodiments optionally comprise the ability to operate at high temperatures, for example, for a given electrical power loading. This allows greater power input to the cathode, which, in turn, permits a higher throughput of workpieces, e.g., compact discs. For example, a preferred embodiment of the present invention is useful in increasing productivity of coating processes for compact discs. In some instances, twice as many discs are coated, relative to the prior art, for each target mounted in the deposition chamber.

It is therefore seen that the present invention comprises embodiments that solve problems found in the prior art. In many embodiments, the present invention increases the efficiency of the deposition process and yields a consumed product of greater value.

The present invention is disclosed in further detail below with reference to the drawings. Referring to FIG. 1, a perspective view of a target assembly 2 of a preferred embodiment of the present invention is shown. As shown in FIG. 1, the target assembly of this embodiment comprises a target 10 and a clamp 60. A perspective bottom side view of the clamp 60 of this embodiment is shown in FIG. 2, separate from the target 10.

Figure 3:
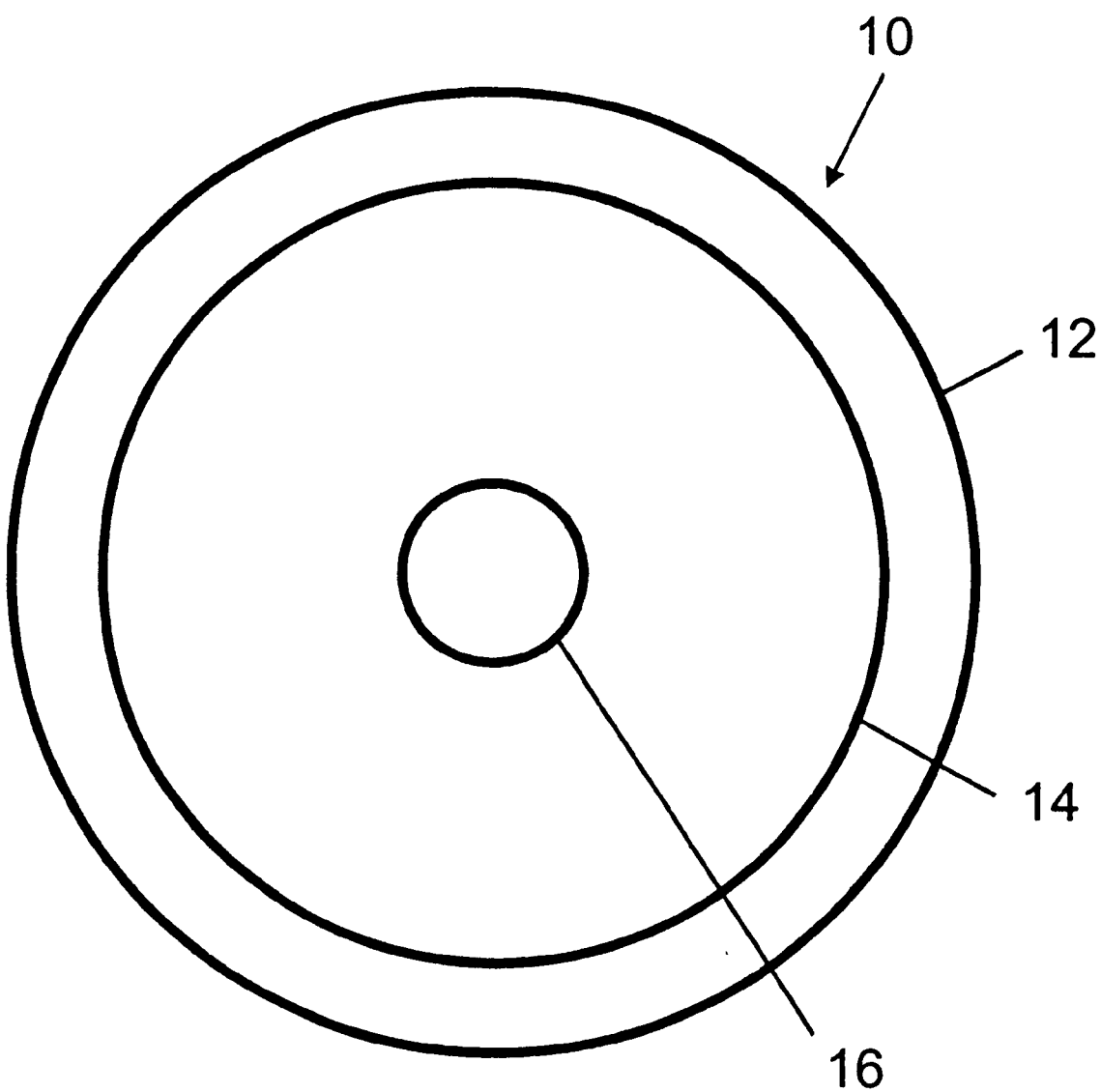
FIG. 3 is a top view of a target of the preferred embodiment of the present invention as shown in FIG. 1.
Figure 4:
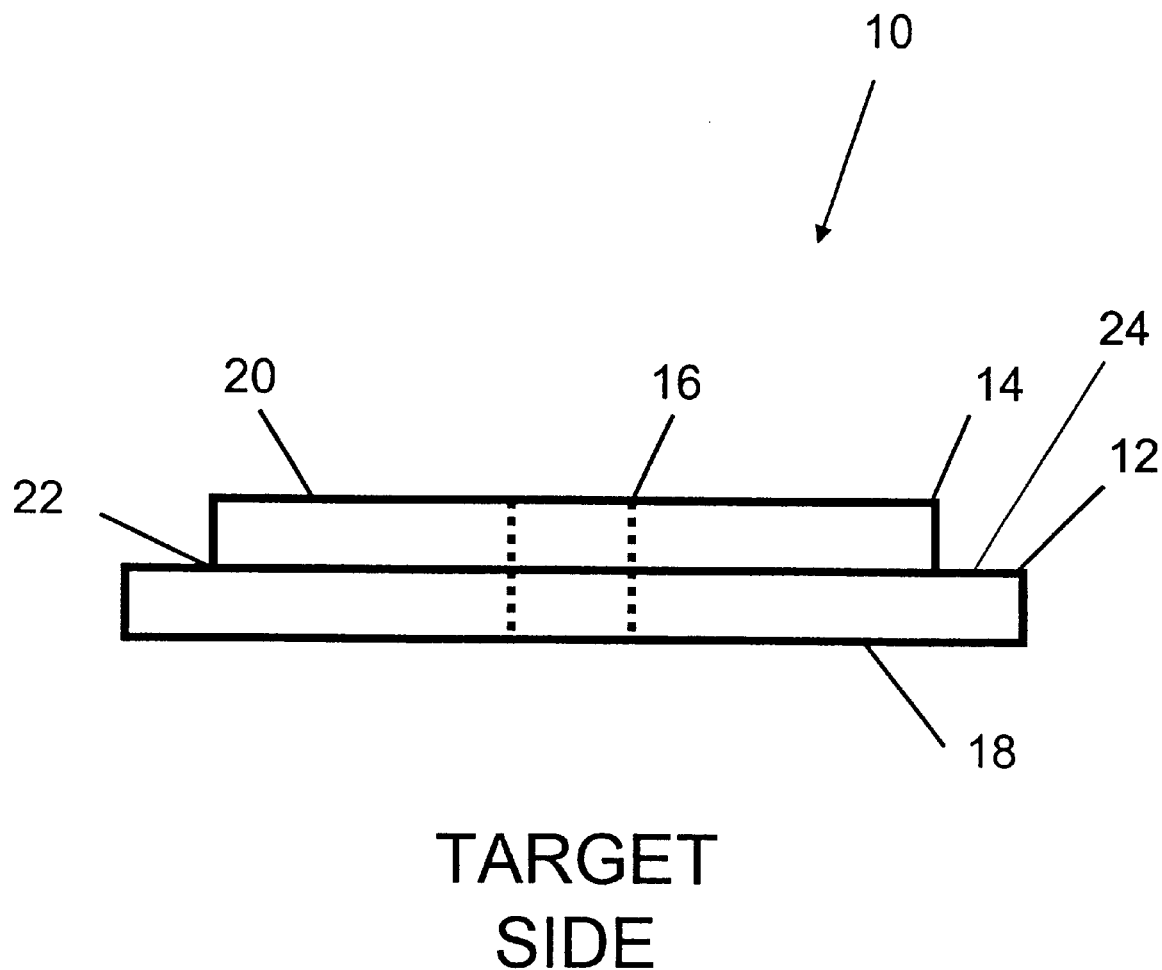
FIG. 4 is a side view of the target of the preferred embodiment of the present invention as shown in FIG. 1.

Referring to FIG. 3, a top view of the target 10 of the preferred embodiment of FIG. 1 is shown. According to this preferred embodiment, the target is machined from a single piece of target material. The target as shown in FIG. 3 comprises an outer diameter 12, an intermediate diameter 14 and an inner diameter 16 about an aperture. A side view of the target of FIG. 3 is shown in FIG. 4. With reference to FIGS. 3 and 4, the target of this embodiment comprises a hat-shape comprising a brim. The brim extends from the secondary diameter 14 to the outer diameter 12 and comprises an upper surface 24. The brim forms a shoulder or step 22 at the intersection of its upper surface 24 and the intermediate diameter 14. As represented by the dashed lines, the aperture comprising inner diameter 16 extends from a top surface 20 of the target 10 to a bottom surface 18 of the target 10. While FIGS. 3 and 4 show a hat-shaped target comprising a circular configuration, the present invention is not limited to hat-shaped targets or targets with circular configurations. However, the presence of a brim or another extended portion is useful for cooperating with a clamp to form a target assembly.

Figure 2:
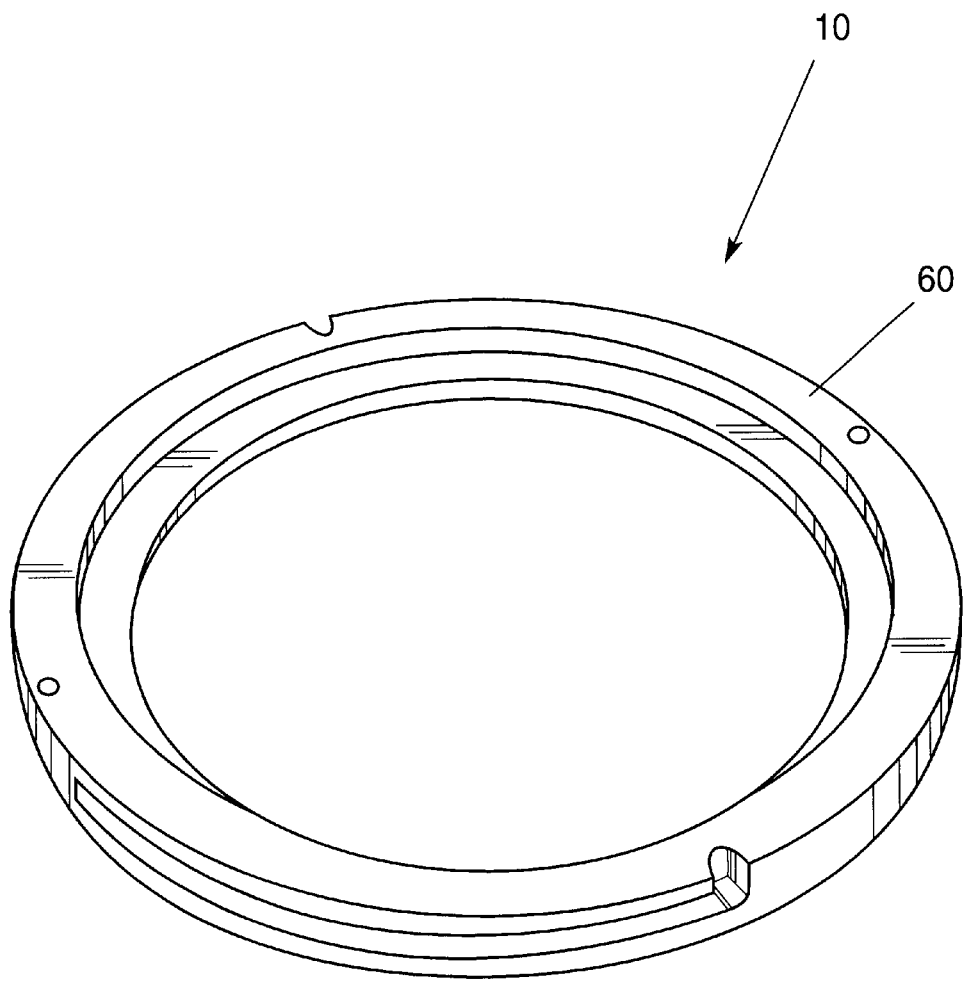
FIG. 2 is a perspective view of a clamp of the target assembly of the preferred embodiment of the present invention as shown in FIG. 1.
Figure 5:
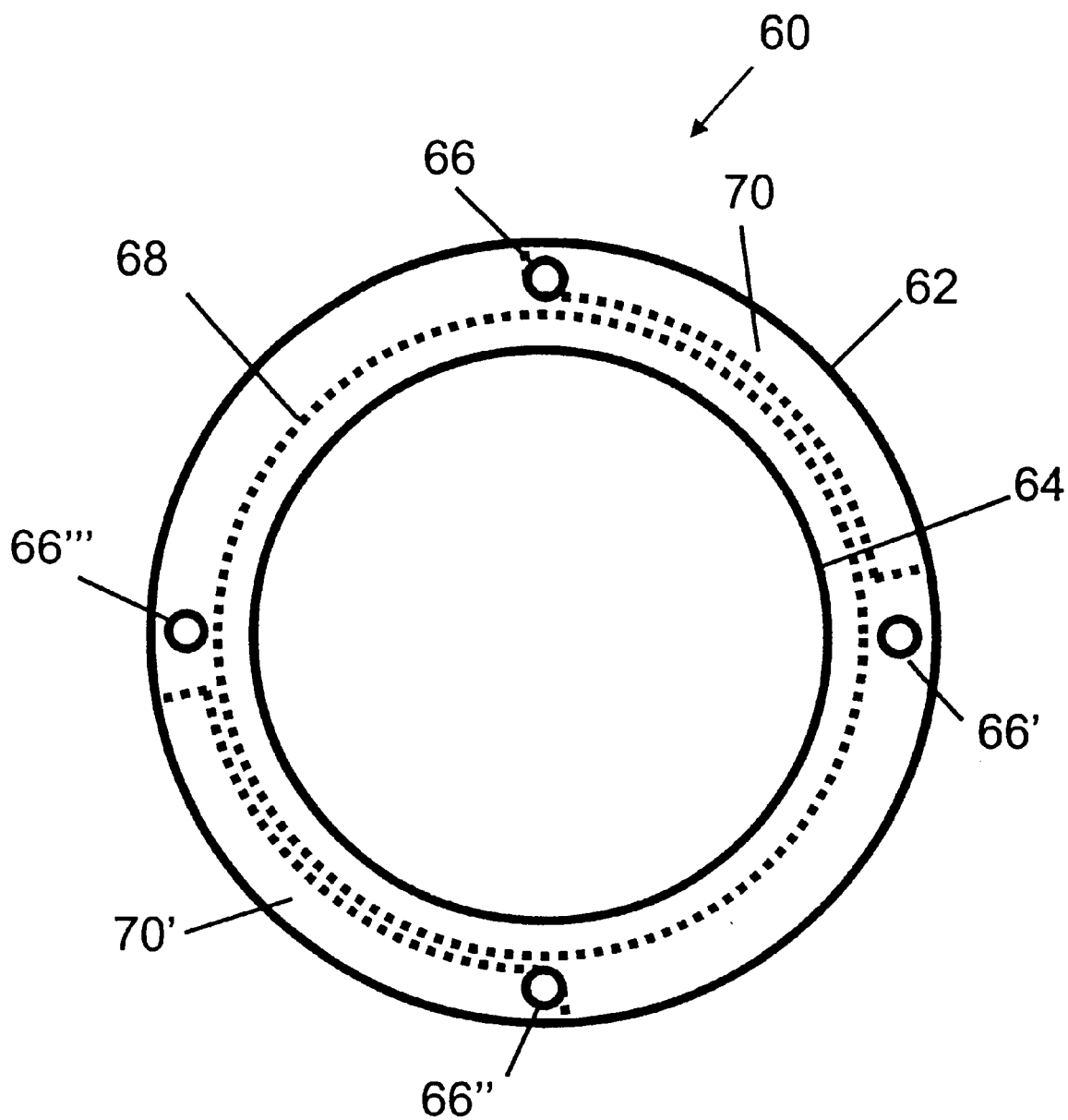
FIG. 5 is a top view of a clamp of the preferred embodiment of the present invention as shown in FIGS. 1 and 2.

A top view of the clamp 60 of the preferred embodiment of FIGS. 1 and 2 is shown in FIG. 5. This particular substantially ring-shaped clamp 60 comprises an outer diameter 62 and an inner diameter 64. In this embodiment, disposed between the outer diameter 62 and inner diameter 64 is an intermediate diameter 68, represented by a dashed line in FIG. 5. The clamp of this embodiment further comprises apertures 66, 66', 66", 66'" located between the outer diameter 62 and the intermediate diameter 68. This embodiment further comprises slots 70, 70' disposed substantially between adjacent apertures 66, 66' and 66", 66'". According to this embodiment, the slots 70, 70' are open along outer diameter 62 and closed at a diameter smaller than outer diameter 62 and intermediate diameter 68. The slots 70, 70' optionally receive ears of a piece of processing equipment through apertures 66, 66'. In this case, apertures 66, 66' optionally comprise at least a partially open side along outer diameter 62 to facilitate reception of the ears, as shown in FIG. 6.

According to this preferred embodiment, if the processing equipment comprises ears, the target 10 is placed in the clamp 60 and the clamp 60 is placed on the processing equipment such that the two opposing apertures 66, 66" receive the ears. The clamp 60 and/or target 10 are then, rotated such that the ears travel in the slots 70, 70'. Each of the slots 70, 70' optionally comprises an inclined surface that contacts an ear. In such an embodiment, the clamp 60 and/or target 10 are drawn toward the processing equipment as the clamp 60 and/or target 10 are rotated because of the inclined surface in each slot 70, 70'. The apertures 66', 66'" optionally provide points for attaching a tool to rotate the target 10 and/or clamp 60 for attaching and/or detaching the target assembly 2 from processing equipment. Alternatively, or in combination with such a rotating and/or ear attachment mechanism, the apertures 60, 60', 60", 60'" receive bolts, posts and/or other attachment devices for attaching the target assembly 2 to the processing equipment.

Figure 6:
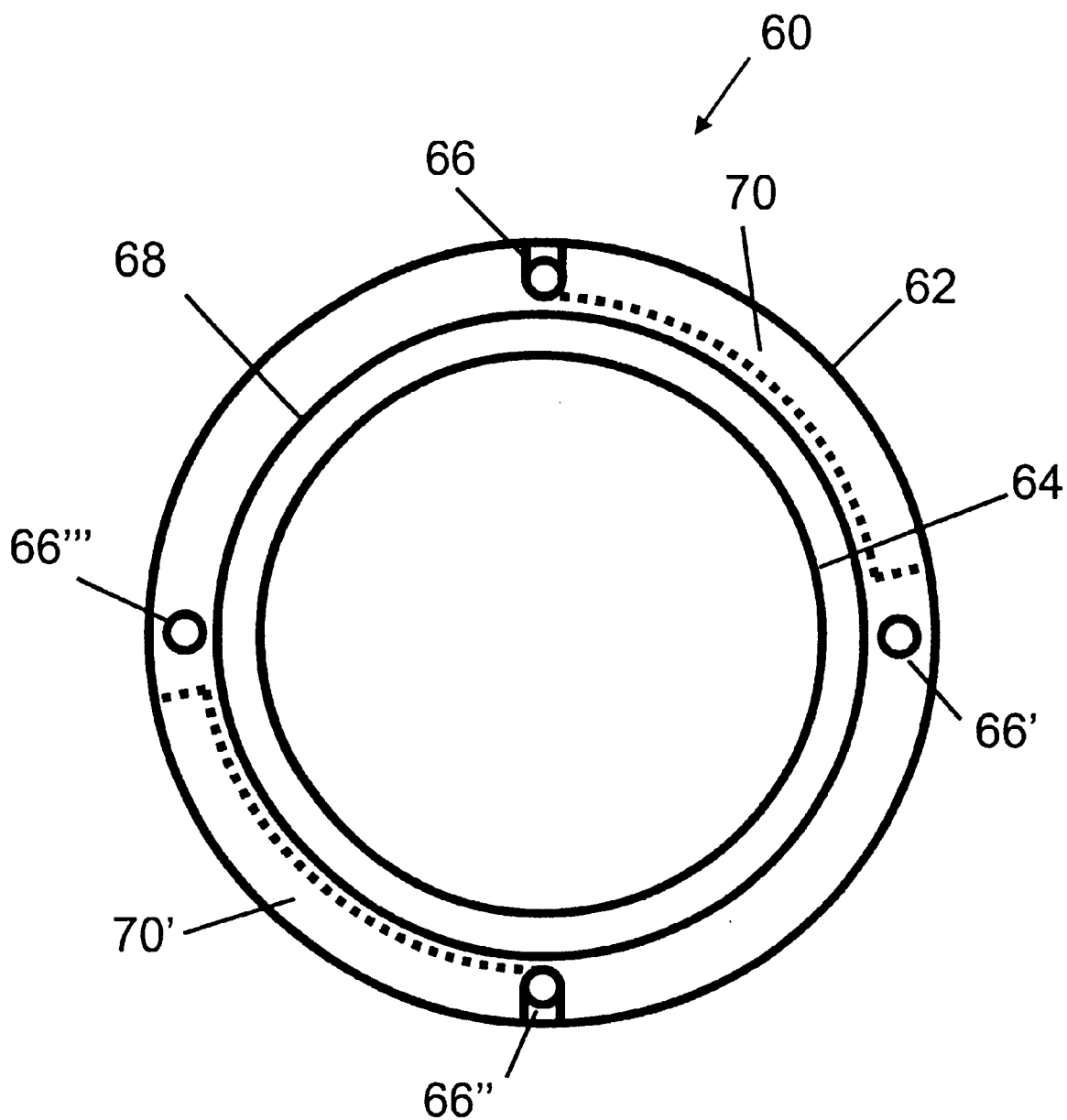
FIG. 6 is a bottom view of the clamp of the preferred embodiment of the present invention as shown in FIGS. 1, 2 and 5.
Figure 7:
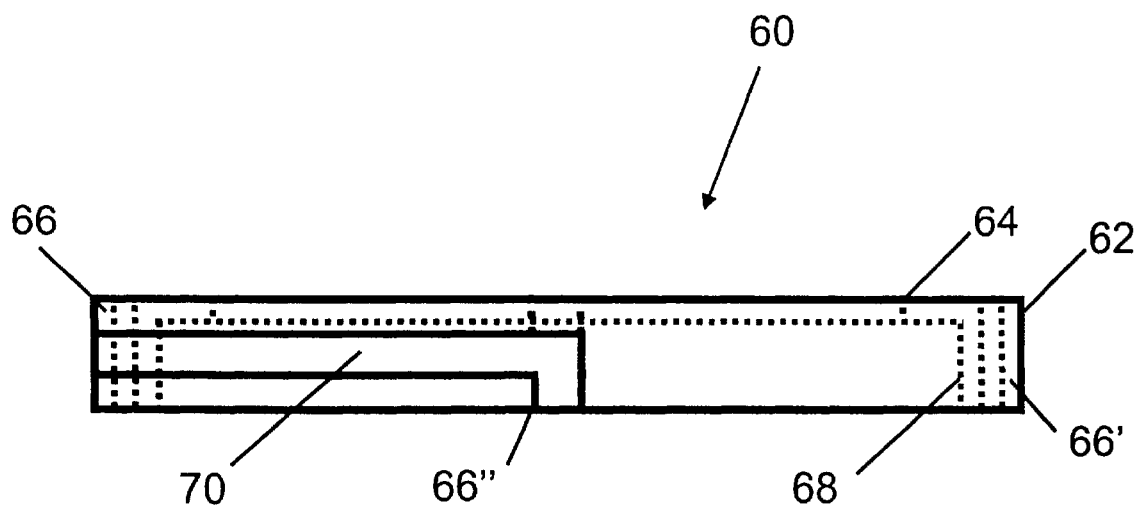
FIG. 7 is a side view of the clamp of the preferred embodiment of the present invention as shown in FIGS. 1, 2, 5 and 6.

A bottom view of the clamp 60 of this preferred embodiment is shown in FIG. 6. FIG. 6 more clearly depicts the open side of the apertures 66, 66" that optionally receive ears of the processing equipment. A side view of the clamp 60 of this preferred embodiment is shown in FIG. 7. A single slot 70 is shown in the side view of FIG. 7. The view of FIG. 7 further depicts the open side of an aperture 66". While this embodiment comprises two discrete slots, 70, 70', other embodiments comprise a single slot that optionally comprises a continuous slot and/or a discrete slot. A continuous slot is, for example, a slot that has no beginning or end, for example, but not limited to, a slot that follows the perimeter of a clamp. Other embodiment optionally comprise more than two slots wherein the shapes of the slots optionally differ from each other.

Figure 8:
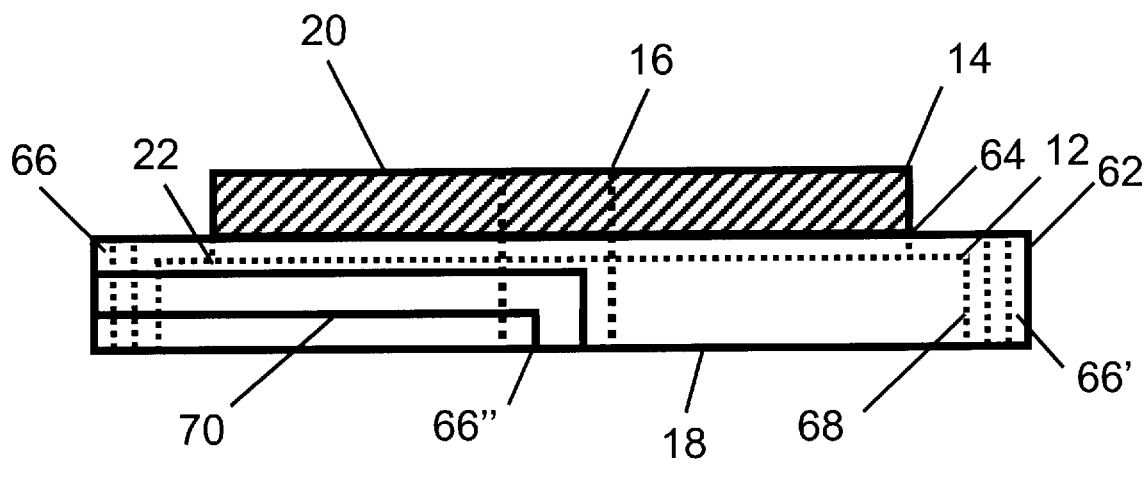
FIG. 8 is a side view of the target assembly of the preferred embodiment of the present invention as shown in FIG. 1.

FIG. 8 shows a side view of the target assembly of the preferred embodiment depicted in the foregoing figures (FIGS. 1–7). As shown, the intermediate diameter 14 of the target 10 substantially matches the inner diameter 64 of the clamp 60 while the outer diameter 12 of the target 10 substantially matches the intermediate diameter 68 of the clamp 60. In this embodiment, the top surface 24 of the brim of the target 10 contacts the clamp on a surface disposed between the inner diameter 64 of the clamp 60 and the intermediate diameter 68 of the clamp 60. As shown, the target 10 rises above the clamp 60 along the target's intermediate diameter 14. The proportions shown in FIGS. 1–8 are for purposes of describing this particular embodiment and are not to be interpreted as limiting the present invention.

Figure 9:
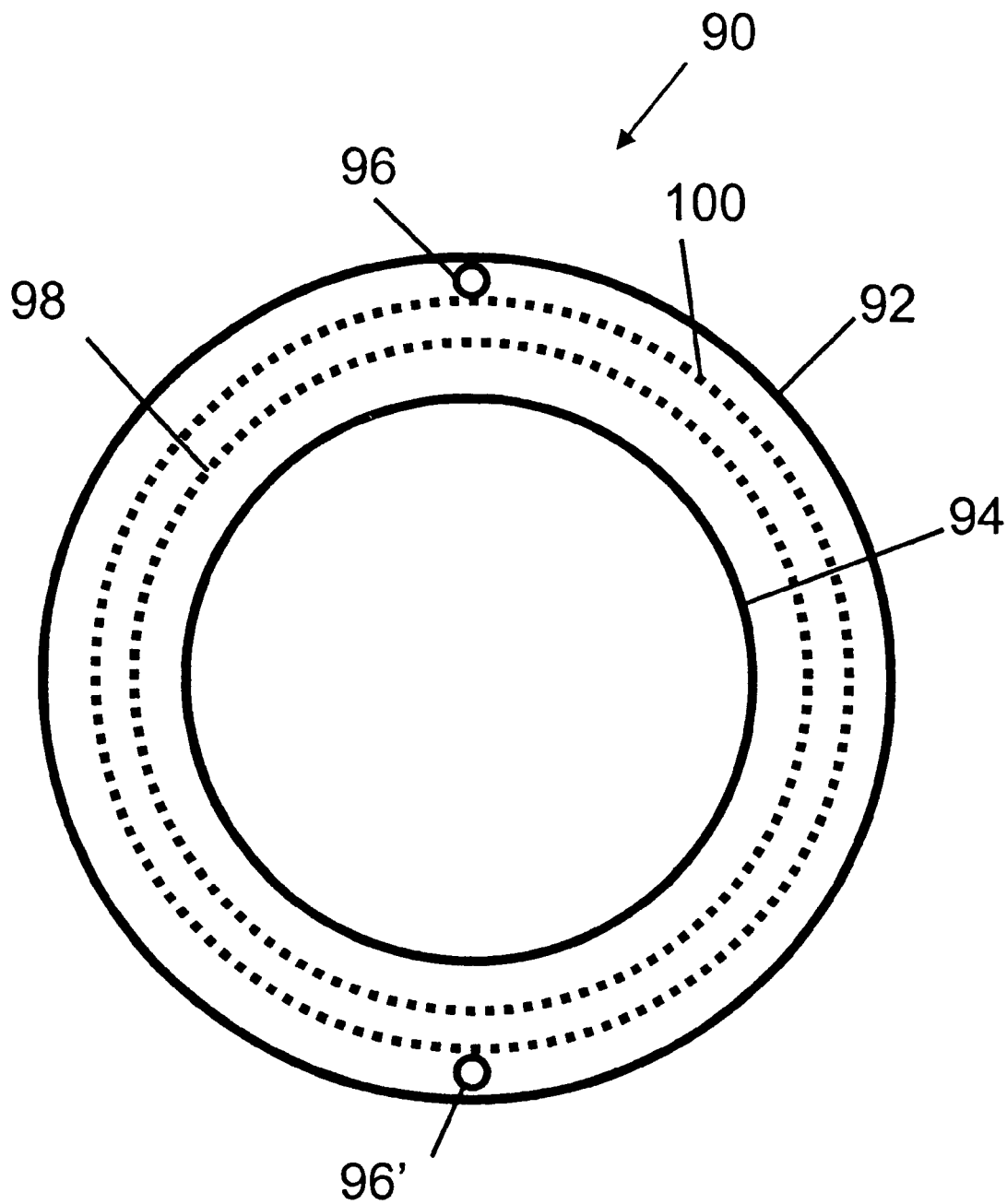
FIG. 9 is a top view of a clamp of an embodiment of the present invention.

An alternative embodiment of a clamp of the present invention is shown in FIG. 9. As shown in this top view, the clamp 90 comprises an outer diameter 92, an inner diameter 94 and an inner intermediate diameter 98 and an outer intermediate diameter 100. In addition, this clamp 90 comprises two opposing apertures 96, 96' positioned between the outer intermediate diameter 100 and the outer diameter 92.

Figure 10:
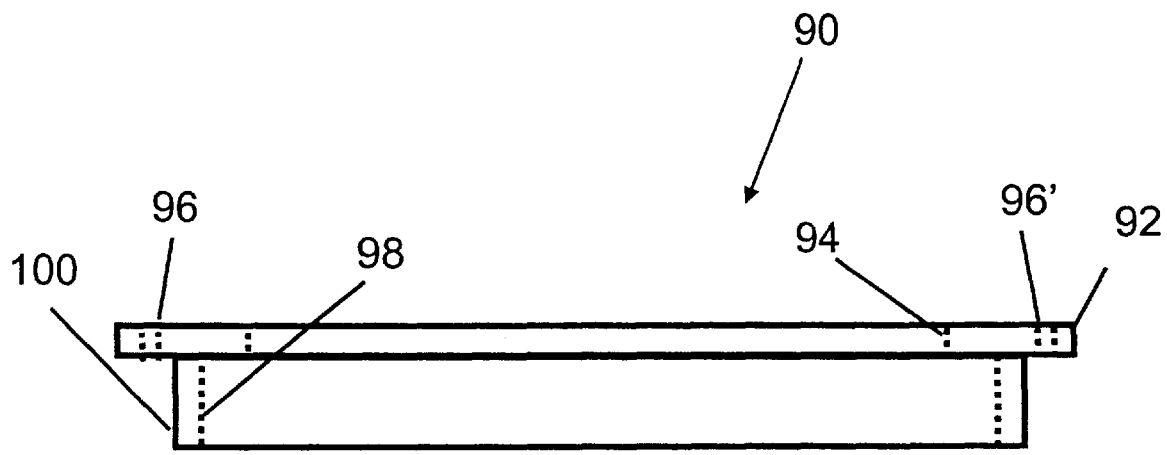
FIG. 10 is a side view of the clamp of the embodiment of the present invention as shown in FIG. 9.
Figure 11:
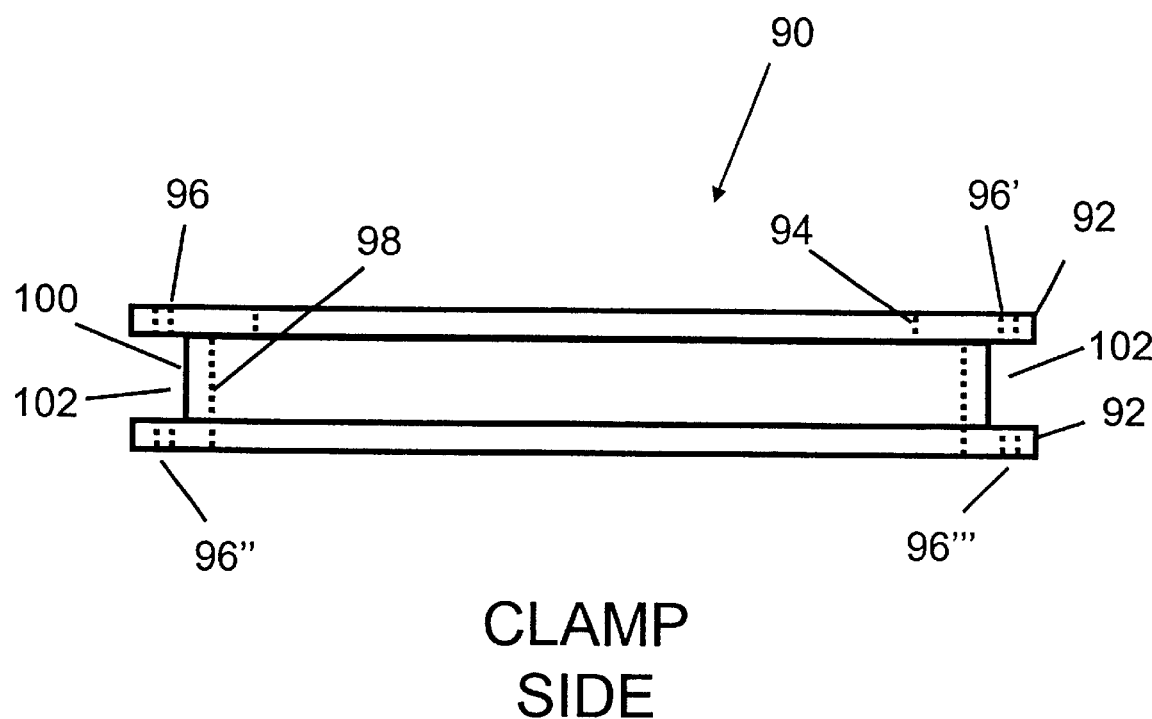
FIG. 11 is a side view of a variation of the clamp of the present invention as shown in FIG. 10.

A side view of the clamp 90 of the alternative embodiment of FIG. 9 is shown in FIG. 10. As shown in this side view of the clamp 90, no slots are present. Instead, the clamp 90 is attached to the processing equipment by bolts, studs, and the like through apertures 96, 96'. However, in a variation of this alternative embodiment, shown in FIG. 11, a continuous slot 102 is present that encircles a midportion of the clamp 90. While the slot 102 as shown in FIG. 11 comprises a horizontal lower surface, this surface is optionally grooved, inclined, or otherwise modified to facilitate attachment to the processing equipment. The slotted variation of FIG. 11 also comprises two additional apertures 96", 96"'. These apertures optionally comprise an open side at the outer diameter 92. As explained supra, an open side facilitates reception of ears or similar attachment devices positioned on process equipment.

Figure 12:
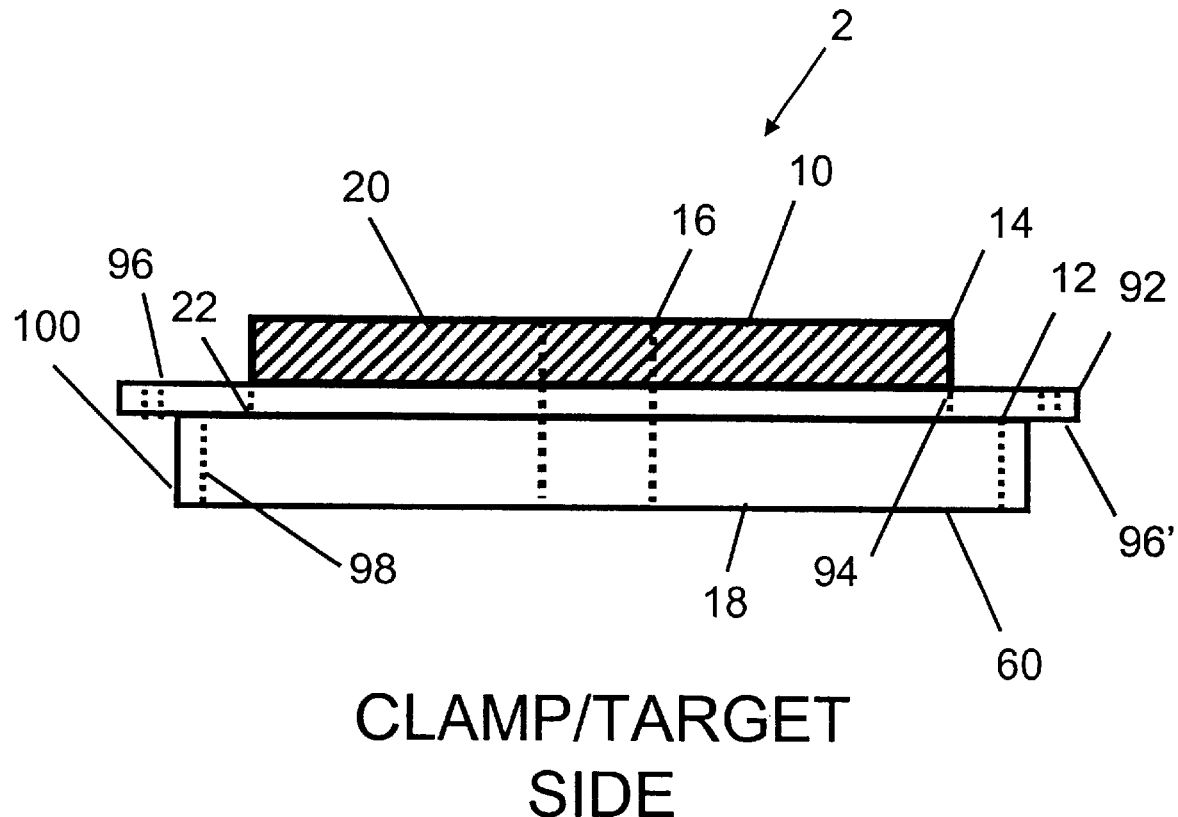
FIG. 12 is a side view of an embodiment of a target assembly of the present invention.

Referring to FIG. 12, a target assembly 2 is shown comprising the clamp embodiment shown in FIG. 10. As shown, the intermediate diameter 14 of the target 10 substantially matches the inner diameter 94 of the clamp 60 and the outer diameter 12 of the target 10 substantially matches the inner intermediate diameter 98 of the clamp 60.

Figure 13A:
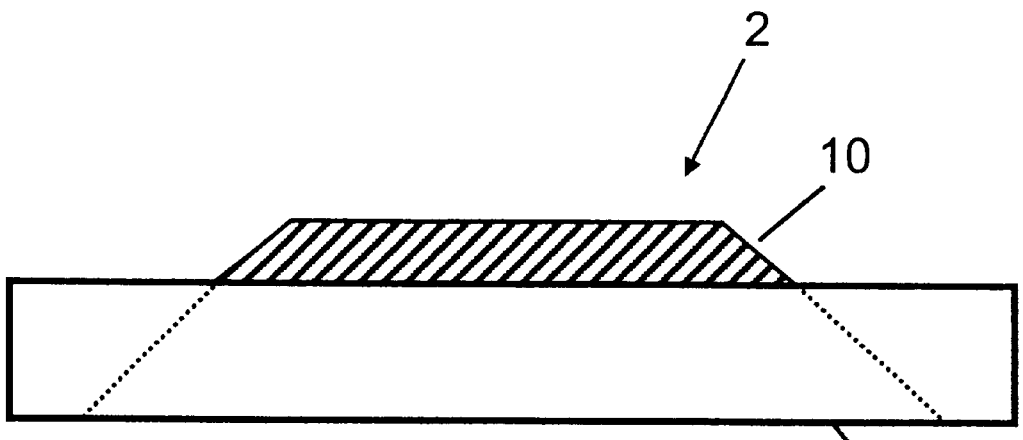
FIG. 13A is a side view of a target assembly of an embodiment of the present invention.
Figure 13B:
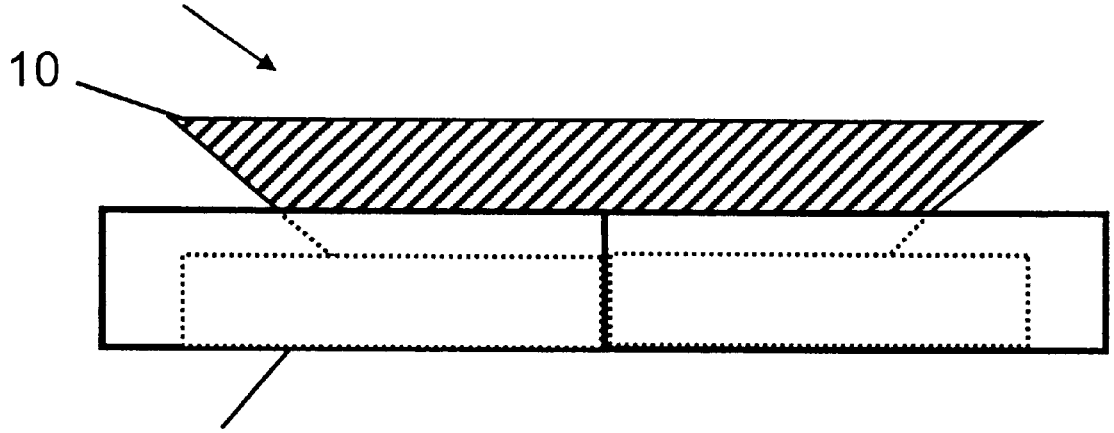
FIG. 13B is a side view of a target assembly of an embodiment of the present invention.
Figure 13C:
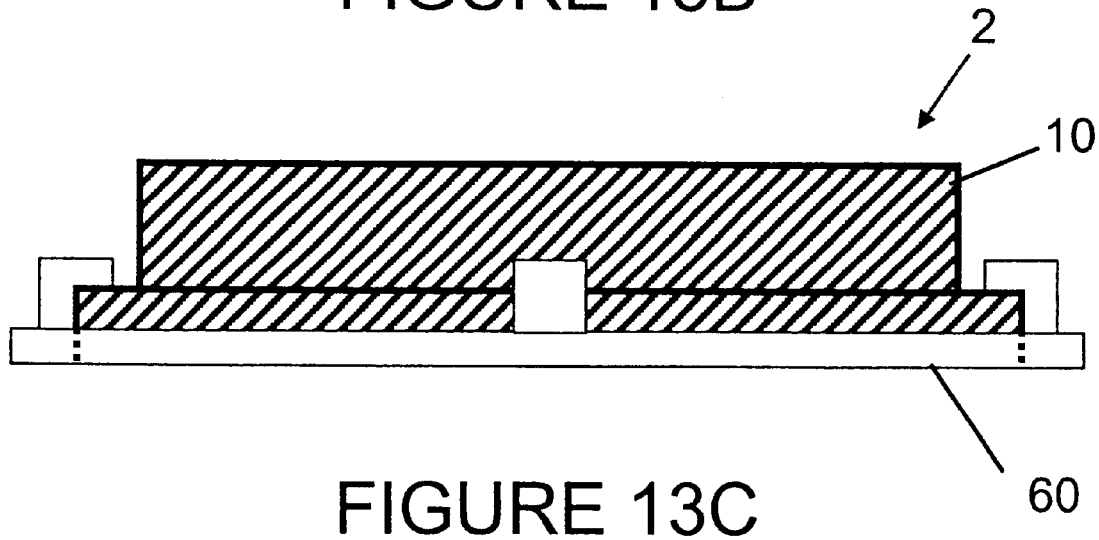
FIG. 13C is a side view of a target assembly of an embodiment of the present invention.

Referring to FIGS. 13A, 13B and 13C, various other non-limiting embodiments of the present invention are shown. FIG. 13A shows a side view of a target assembly 2 comprising a substantially cone-shaped target 10. The accompanying clamp 60 comprises, for example, a stainless steel or other suitable material known in the art of PVD and similar processes. Note that the target 10 of FIG. 13A does not comprise a hat-like brim, but rather a sloped surface that cooperates with the clamp 60. In this embodiment, the clamp comprises an inclined inner surface for receiving the target, which comprises, for example, a partial cone shape. In an alternative embodiment, the sloped surface of the target 10 comprises threads or other mechanism for ensuring cooperation with the clamp 60. In an embodiment wherein the target 10 comprises threads, the clamp comprises matching threads for securing the target 10 to the clamp 60.

FIG. 13B shows a side view of a target assembly 2 comprising a target 10 wherein the target comprises a brim and an expanding cross section. The clamp 60 shown in FIG. 13B comprises, for example, at least two pieces that cooperatively clamp the target 10 to the processing equipment. FIG. 13C shows a side view of a target assembly 2 comprising a hat-shaped target 10. The associated clamp 60 comprises, for example, a base ring and fastening prongs for cooperatively clamping the target 10 to the processing equipment. Of course, the present invention contemplates and encompasses targets and/or clamps comprising other shapes and cooperative structures. However, the targets and clamps of FIGS. 13A, 13B, and 13C provide guidance as to preferred embodiments.

In other embodiments, a clamp of the present invention optionally comprises the ability to clamp multiple targets to the processing equipment. In such an embodiment, an array of targets is fitted to a clamp and the target assembly attached to the processing equipment. Target assemblies of the present invention are adaptable to PVD processing equipment and processing equipment for processes similar to PVD that are used and/or known in the art.

The present invention also encompasses targets and/or clamps comprising cooling, heating and/or electrical circuits. For example, a clamp comprising an electrical circuit for heating and/or creation of electrical and/or magnetic fields is within the scope of the present invention. Such circuits are known in the art of electronics. In addition, clamps and/or targets of the present invention optionally comprise at least one channel for circulation of a cooling media. Such channels optionally comprise connectors for connecting to an existing cooling system of, for example, the processing equipment.

Industrial Applicability:

The invention is further illustrated by the following non-limiting examples.

EXAMPLE

A target assembly according to a preferred embodiment of the present invention was constructed from gold and stainless steel. As shown in FIGS. 13A and 13B, the target comprised gold and the clamp comprised stainless steel. This target assembly was tested and found to exhibit superior productivity when compared to traditional, prior art clamps.

Figure 14B:
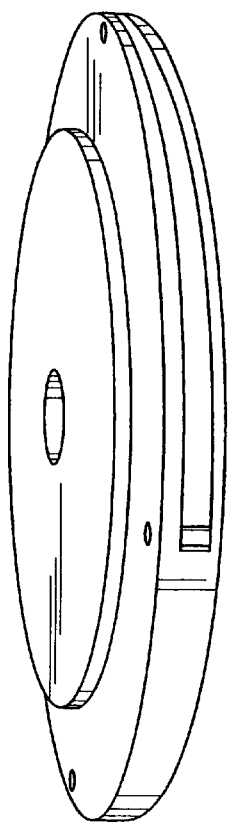
FIG. 14B is a side perspective view of a target assembly of a preferred embodiment of the present invention.
Figure 14A:
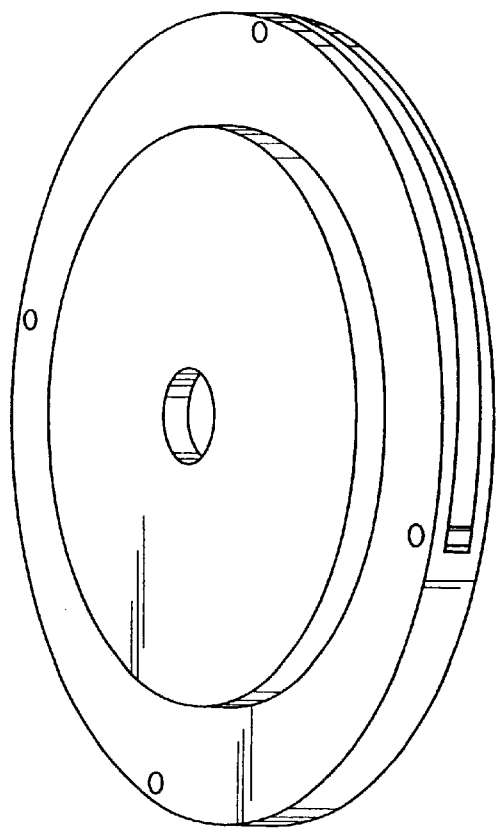
FIG. 14A is a top perspective view of a target assembly of a preferred embodiment of the present invention.

The clamp of this Example is shown in further detail in FIGS. 14A and 14B. FIG. 14A shows a top perspective view of the bottom side of the inventive clamp while FIG. 14B shows a substantially side perspective view of the bottom side of the inventive clamp.

Figure 15B:
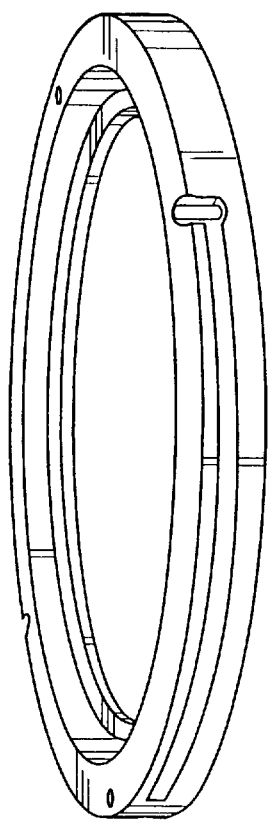
FIG. 15B is a side perspective view of a clamp of a preferred embodiment of the present invention.
Figure 15A:
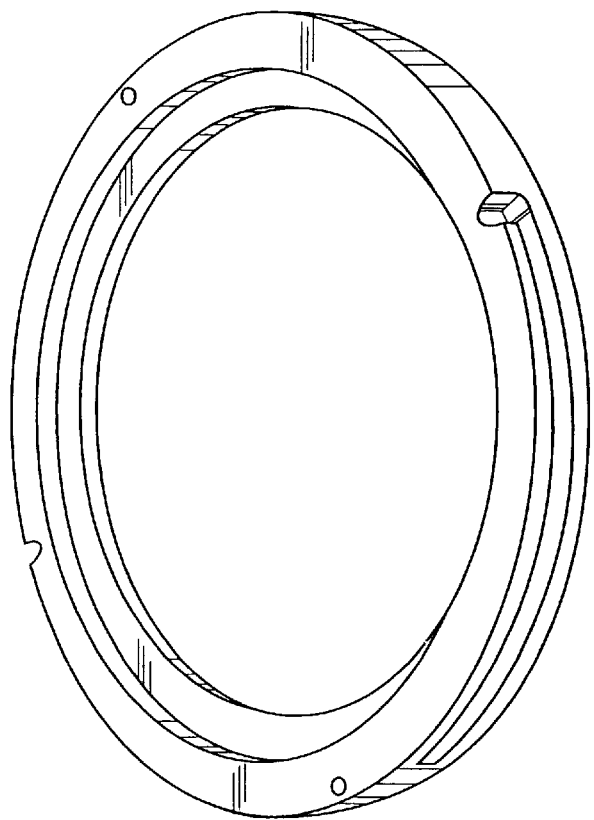
FIG. 15A is a top perspective view of a clamp of a preferred embodiment of the present invention.
Figure 16A:
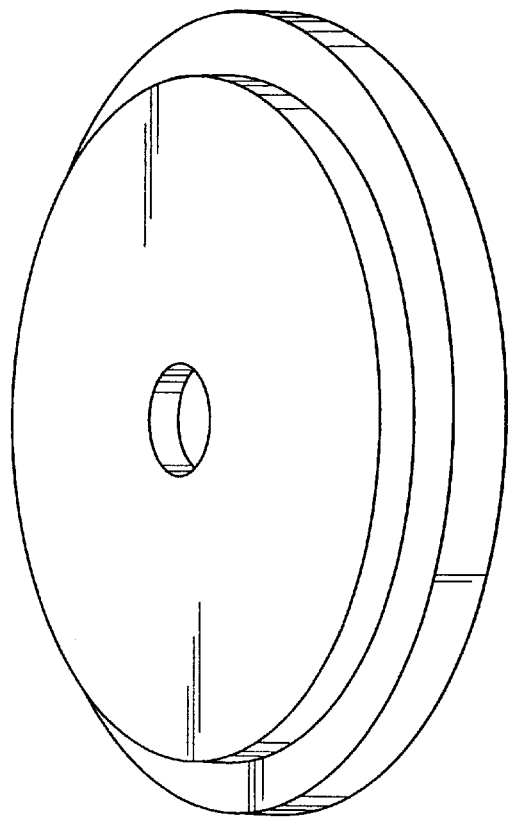
FIG. 16A is a top perspective view of a target assembly of a preferred embodiment of the present invention (right) and a spent target (left)
Figure 16A:
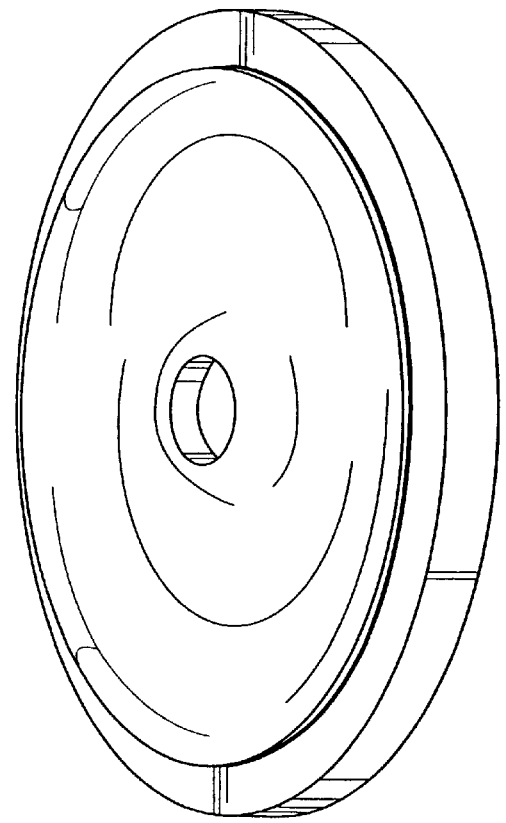
Figure 16B:
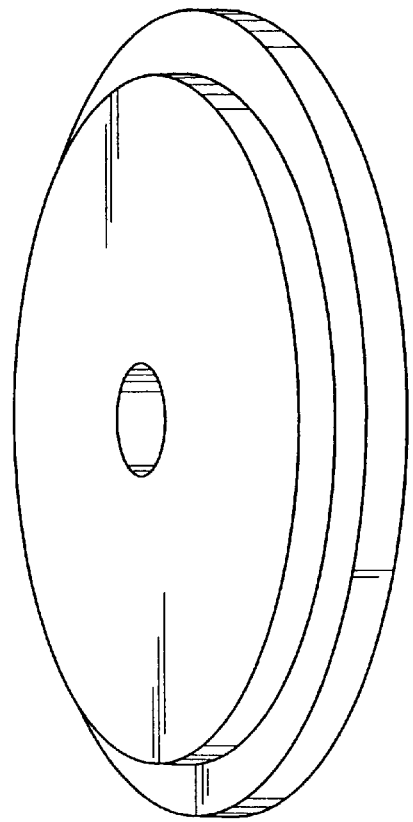
FIG. 16B is a side perspective view of a target assembly of a preferred embodiment of the present invention (right) and a spent target (left).
Figure 16B:
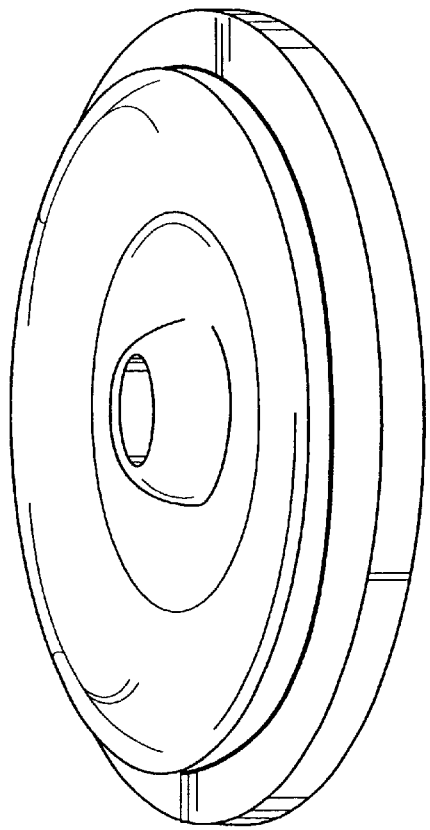

The target of this Example is shown in further detail in FIGS. 15A and 15B. FIG. 15A shows a top perspective view of the topside of the inventive gold target of this example (right) along with a spent silver target (left). FIG. 15B shows a substantially side perspective of the inventive gold target of this example (right) along with a spent silver target (left).

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A target assembly separate from an installation assembly for PVD processing equipment comprising:
   a target in a stepped shape comprising a consumable center portion; and
   a reusable clamp outer component in a stepped shape and mounted to said stepped shaped target via steps corresponding to steps of said target, said clamp comprising at least one aperture for receiving at least one ear disposed on said separate installation assembly;
   wherein said clamp clamps said target assembly to the installation assembly of the processing equipment.

2. The target assembly of claim 1 wherein said clamp comprises stainless steel.

3. The target assembly of claim 1 wherein said clamp comprises a ring shape.

4. The target assembly of claim 1 wherein said clamp comprises a plurality of cooperative pieces.

5. The target assembly of claim 1 wherein said target comprises a sloped surface.

6. The target assembly of claim 5 wherein said clamp comprises an inclined inner surface for receiving a sloped surface of said target.

7. The target assembly of claim 1 wherein said clamp assembly attaches to the processing equipment through rotation of said target assembly about a central axis of said assembly.

8. The target assembly of claim 1 wherein said target comprises a metal.

9. The target assembly of claim 1 wherein said target comprises a metal selected from the group consisting of gold, silver, niobium, tantalum, platinum, palladium, rhodium, iridium, ruthenium, and osmium.

10. The target assembly of claim 9 wherein said metal comprises an alloy.

11. The target assembly of claim 9 wherein said metal comprises a metal compound.

12. The target assembly of claim 1 wherein said target comprises a ceramic.

13. The target assembly of claim 12 wherein said ceramic comprises CD-RW material.

14. The target assembly of claim 1 wherein said target comprises at least one aperture.

15. The target assembly of claim 14 wherein said at least one aperture comprises at least one central aperture positioned on a central axis of said target.

16. The target assembly of claim 1 wherein said target comprises at least one horizontal cross-section selected from the group consisting of circular, oval, ellipsoidal, and polygonal cross-sections.

17. The target assembly of claim 16 wherein said clamp comprises an opening for receiving at least one of said at least one cross-sections of said target.

18. A target assembly separate from an installation assembly for PVD processing equipment comprising:
   a target in a stepped shape comprising a consumable center portion; and
   a reusable clamp outer component in a stepped shape and mounted to said stepped shape target via steps corresponding to steps of said target;
   wherein said clamp clamps said target assembly to the installation assembly of the processing equipment and a clamp assembly attaches to the processing equipment through rotation of said target assembly about a central axis of said assembly, wherein said rotation engages at least one ear disposed on a separate installation, assembly within at least one internal member of said clamp selected from the group consisting of horizontal surfaces, inclined surfaces, grooved surfaces, and declined surfaces.

19. The target assembly of claim 18 wherein said clamp comprises stainless steel.

20. The target assembly of claim 18 wherein said clamp comprises a ring shape.

21. The target assembly of claim 18 wherein said clamp comprises a plurality of cooperative pieces.

22. The target assembly of claim 18 wherein said target comprises a sloped surface.

23. The target assembly of claim 22 wherein said clamp comprises an inclined inner surface for receiving a sloped surface of said target.

24. The target assembly of claim 18 wherein said target comprises a metal.

25. The target assembly of claim 18 wherein said target comprises a metal selected from the group consisting of gold, silver, niobium, tantalum, platinum, palladium, rhodium, iridium, ruthenium, and osmium.

26. The target assembly of claim 25 wherein said metal comprises an alloy.

27. The target assembly of claim 25 wherein said metal comprises a metal compound.

28. The target assembly of claim 18 wherein said target comprises a ceramic.

29. The target assembly of claim 28 wherein said ceramic comprises CD-RW material.

30. The target assembly of claim 18 wherein said target comprises at least one aperture.

31. The target assembly of claim 30 wherein said at least one aperture comprises at least one central aperture positioned on a central axis of said target.

32. The target assembly of claim 18 wherein said target comprises at least one horizontal cross-section selected from the group consisting of circular, oval, ellipsoidal, and polygonal cross-sections.

33. The target assembly of claim 32 wherein said clamp comprises an opening for receiving at least one of said at least one cross-sections of said target.

34. A method of using a target assembly with processing equipment comprising the steps of:
   a) providing a target assembly separate from an installation assembly comprising providing a target in a stepped shape comprising a consumable center portion and a reusable clamp, the clamp comprising at least one internal member selected from the group consisting of horizontal surfaces, inclined surfaces grooved surfaces, and denclined surfaces, wherein the clamp clamps the target to the processing equipment; and
   b) clamping the target assembly to an installation assembly of the processing equipment.

35. The method of claim 34 wherein the target comprises a known weight.

36. The method of claim 35 further comprising the step of operating the processing equipment to diminish the weight of the target.

37. The method of claim 36 further comprising the step of removing the target assembly from the installation assembly of the processing equipment and from the clamp after the operating step.

38. The method of claim 36 further comprising the step of determining the weight of the target after the operating step.

39. A method of using a target assembly with processing equipment comprising the steps of:
   a) providing a target assembly separate from an installation assembly comprising providing a target in a stepped shape comprising a consumable center portion and a reusable clamp, the clamp comprising at least one internal member selected from the group consisting of horizontal surfaces, inclined surfaces, grooved surfaces, and declined surfaces, wherein the clamp clamps the target to the processing equipment; and b) clamping the target assembly to an installation assembly of the processing equipment;

c) operating the processing equipment to diminish the weight of the target;

d) removing the target assembly from the process equipment; and e) determining the weight of the target.

40. A method of using a target assembly with processing equipment comprising the steps of:

a) providing a target assembly separate from an installation assembly comprising providing a target in a stepped shape comprising a consumable center portion and a reusable clamp;

b) clamping the target assembly to an installation assembly of the processing equipment; and c) attaching a clamp assembly to the processing equipment through rotation of the target assembly about a central axis of the assembly, wherein the rotation engages at least one ear disposed on a separate installation assembly within at least one internal member of said clamp selected from the group consisting of horizontal surfaces, inclined surfaces, grooved surfaces, and declined surfaces.

41. The method of claim 40 wherein the target comprises a known weight.

42. The method of claim 41 further comprising the step of operating the processing equipment to diminish the weight of the target.

43. The method of claim 42 further comprising the step of removing the target assembly from the installation assembly of the processing equipment and from the clamp after the operating step.

44. The method of claim 40 further comprising the step of determining the weight of the target after the operating step.

45. A method of using a target assembly with processing equipment comprising the steps of:

a) providing a target assembly separate from an installation assembly comprising providing a target in a stepped shape comprising a consumable center portion and a reusable clamp;

b) clamping the target assembly to an installation assembly of the processing equipment; and c) attaching a clamp assembly to the processing equipment through rotation of the target assembly about a central axis of the assembly, wherein the rotation engages at least one ear disposed on a separate installation assembly within at least one internal member of said clamp selected from the group consisting of horizontal surfaces, inclined surfaces, grooved surfaces, and declined surfaces;

d) operating the process equipment to diminish the weight of the target;

e) removing the target assembly from the process equipment; and f) determining the weight of the target.

* * * * *